Figure 1:
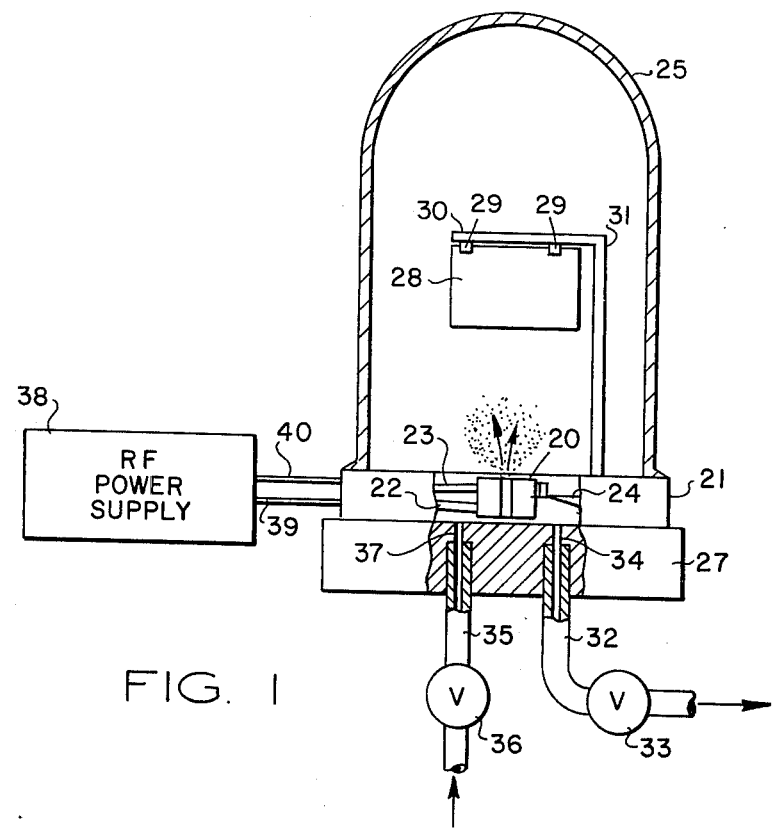

United States Patent [19]

White

[11] 4,016,389
[45] Apr. 5, 1977

[54] HIGH RATE ION PLATING SOURCE

[76] Inventor: Gerald W. White, 5835 Elm Lawn St., Dallas, Tex. 75228

[22] Filed: Feb. 21, 1975

[21] Appl. No.: 551,703

[52] U.S. Cl. .......................... 219/10.49; 118/49.1; 219/10.75; 219/10.79
[51] Int. Cl.² .................................... H05B 5/18
[58] Field of Search ......... 219/10.49, 10.43, 10.75, 219/10.79; 118/49.1, 49.5; 427/45; 13/1, 4, 26, 27

[56] References Cited

UNITED STATES PATENTS

| | | | |
|---|---|---|---|
| 2,386,819 | 10/1945 | Sherman | 219/10.79 |
| 2,584,660 | 2/1957 | Bancroft | 219/10.49 UX |
| 3,008,027 | 11/1961 | Bechius et al. | 219/10.75 X |
| 3,551,115 | 12/1970 | Jamieson et al. | 219/10.49 X |
| 3,906,892 | 9/1975 | Van Cakenberghe | 219/10.49 |
| 3,935,412 | 1/1976 | McDouough et al. | 219/10.49 |

FOREIGN PATENTS OR APPLICATIONS 225,215   11/1959   Australia ...................... 219/10.43

Primary Examiner—Bruce A. Reynolds
Attorney, Agent, or Firm—Warren H. Kintzinger

[57] ABSTRACT

A high rate material vaporizing and ion generating source for controled environment high rate ion plating in providing high particulate energy level deposited film build ups. An externally shielded work coil surrounding the ion material source and fed by an alternating RF frequency power source inductively couples energy to an inductive magnetic field variation responsive material crucible. The crucible is advantageously positioned at the effective center of the coil within a tubular refractory heat shield, also positioned within the turns of the coil, that allows energy to enter the crucible, but heat shield retards radiant heat loss from the crucible region. Atoms of evaporant material, from the material being heated and vaporized in the crucible, pass through the RF energy-created magnetic field in its densest area, axially extended through the center of the oil, with magnetic field lines being generally toroidal, other than as modified by external shielding, outside of the coil winding turns, that floats from all voltage and ground. The ion material plating source provides both vaporizing of the plating material from the crucible and ionization of evaporant material atoms for sustained high rate, high particulate energy level ion plating deposition of plating material, with the ionization occurring primarily in the gas plasma generated with energy input for the ion plating process. Arcing damage to the work coil, of the various embodiments, is prevented by conductive attachment of a reference potential to the work coil itself that allows the device to operate throughout a pressure range from ultra high vacuum to greater than atmospheric pressure.

20 Claims, 15 Drawing Figures

U.S. Patent    April 5, 1977    Sheet 2 of 4    4,016,389

HIGH RATE ION PLATING SOURCE

This invention relates in general to apparatus used in deposition of adherent layers of material on various substrates, and in particular, to a high rate material vaporizing and ion generating source for controlled environment high rate material ion plating.

Ion plating has significant potential for accomplishing many new and exciting things in a great variety of industrial applications. Ion plating processes originally, however, used, for example, filament and boat type sources characteristic of the thin film industry, that although quite successful in many applications still failed to allow ion plating to achieve its full potential—as with high rate, thick film ion material deposition processes, for instance. Refractory composite boats and continuous-feed mechanisms have recently been undergoing significant developmental improvements, but even so, the improved processes still do not provide ion plating results desired. Further, in an effort to attain high rate sources in ion plating, the use of electron beam guns has produced some good results, particularly in the stoichiometric deposition of alloy composites. A significant disadvantage with electron beam guns as sources, however, is that they have not been capable of producing a high percentage of evaporated material ionization in achieving a percentage of ionization of the evaporant, in the order of 3 to 5%. Although such low percentages may be desirable in certain thin-film processes, these percentages are not adequate for ion plating and, with such processes, must be supplemented by ionization occurring in the inert gas plasma. For this reason, and because electron beam guns are basically high vacuum devices, the vacuum system is constructed so as to dynamically maintain inert gas pressure in the plating portion even though high vacuum exists in the section housing the electron beam gun filament. While such systems are reported as successfully operating, they are complex, electronically sophisticated, and expensive.

Essential functions to be accomplished by an ion plating source are those of vaporizing and ionizing that would seem, logically, to be acheivable through the use of RF heating—as this could offer both heating and an intense flux at the source, for ionization of vaporized atoms. All, however, is not direct and simple, with initial RF heating and ionization efforts meeting diaster via intense arcs immediately following plasma initiation, puncturing and thus destroying the source RF work coil. Some attempts to shield-protect the work coil merely served to extend the time to arc occurrence, while, with most approaches, increasing the severity of the inevitable puncturing arc.

An approach that can overcome the arcing problem is the use of total ceramic shielding to allow suppression of the work coil surface by either atmospheric pressure air or cooling liquid. This is, of course, expensive, and such structures have a constant operational threat of cracking and subsequent implosion.

It is, therefore, a principal object of this invention to provide a high rate material vaporizing and atomic particle ion generating source for ion plating systems.

Another object is to eliminate arcing with the material vaporizing and ion generating source of an ion plating system.

A further object is to provide an energy efficient material vaporizer and ion generating source for an ion plating system.

Another object is to minimize maintenance requirements with no heated filaments and relatively high voltages involved.

Still another object is to provide an ion source in an ion plating system contributing to improved quality in films deposited throughout the range from low to very high deposition rates.

Features of this invention useful in accomplishing the above objects include, in a high rate source for ion plating, an externally shielded work coil surrounding the ion material source-containing crucible. An alternating RF power source external to a controlled environment chamber is power output coupled with two coil feed lines through a feed through ring to the work coil that inductively couples alternating RF power to an inductive magnetic field variation responsive material crucible (such as a susceptor made of carbon). To properly couple RF energy to the crucible and its plating material contents, the crucible is positioned at the effective center of the work coil within a tubular refractory heat shield, also positioned within the turns of the coil, that allows inductive RF energy to enter the crucible, but heat shield retards radiant heat loss from the crucible region. With this ion material source structure atoms (or molecules) of evaporant material, from the material being heated and vaporized in the crucible, pass through the coil induced RF energy-created magnetic field in its densest area, axially extended through the center area of the coil. This is with magnetic field lines being generally toroidal, other than as modified by an external shield generally surrounding the outer circumference and the bottom of the outermost coil winding turns. This coil outer shield of an electrically conductive material such as copper is so mounted and insulated as to float from all voltage and ground. The RF coil inductive energy input ion material plating source provides both vaporizing of the plating material from the crucible and ionization of evaporant material atoms for sustained low to high rate, high particulate energy level ion plating deposition of plating material, with the ionization occurring primarily in the gas plasma generated with RF energy input for the ion plating process.

A specific embodiment representing what is presently regarded as the best mode of carrying out the invention is illustrated in the accompanying drawings.

Figure 2:
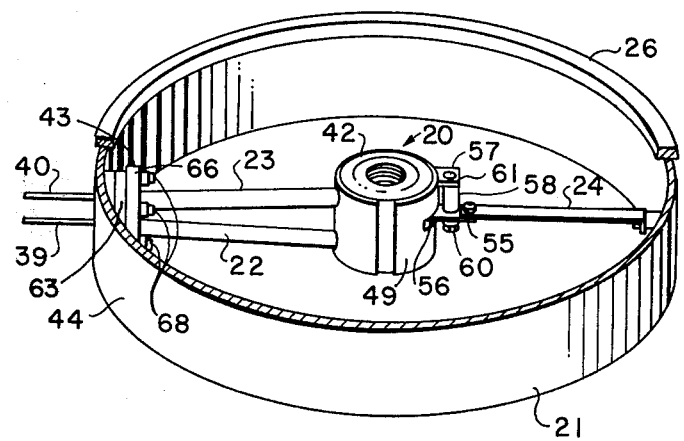
Figure 3:
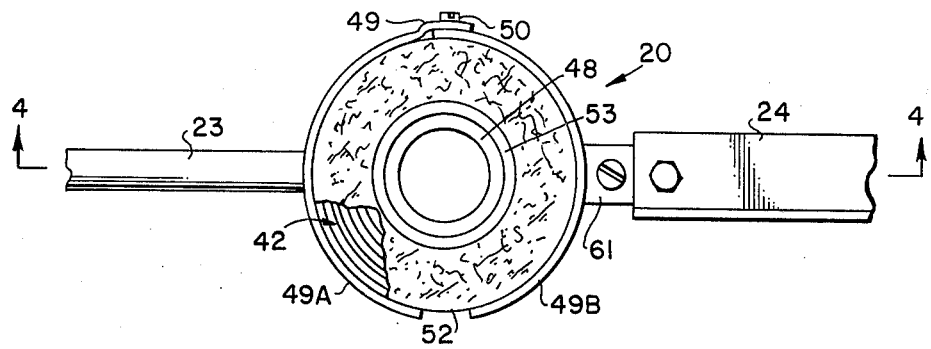
Figure 4:
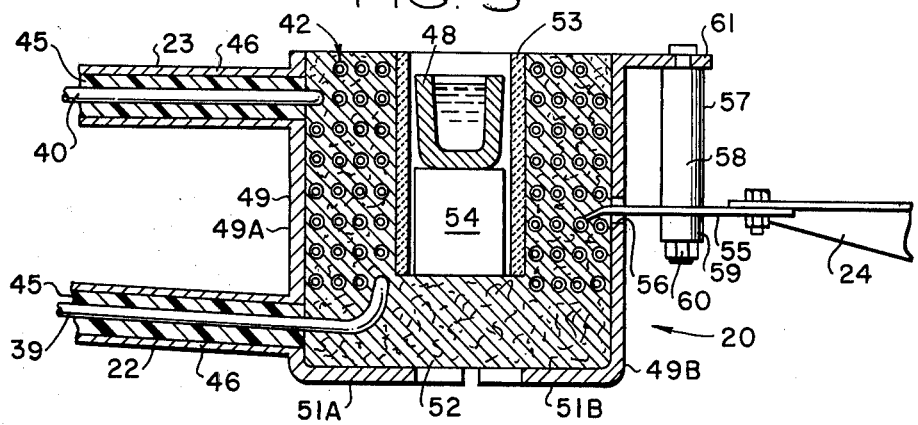
Figure 5:
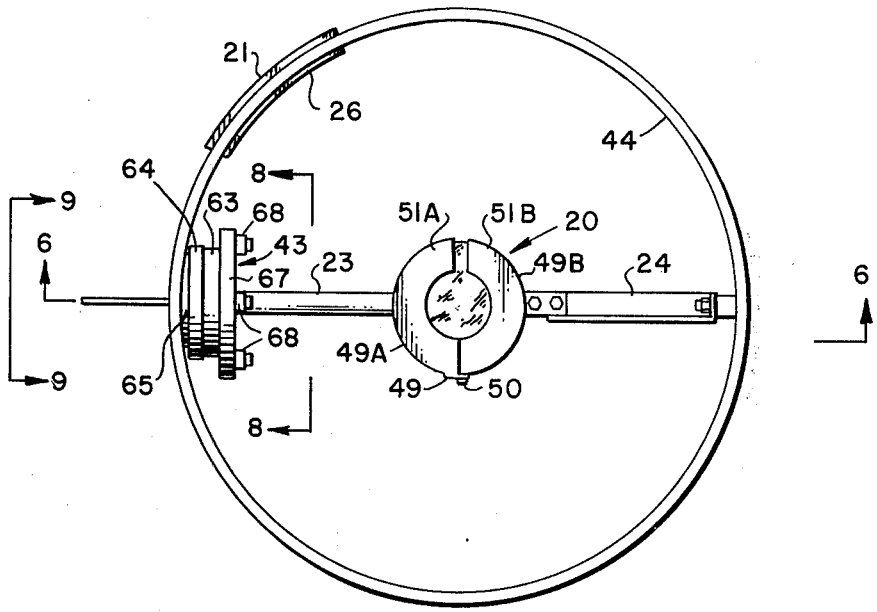
Figure 6:
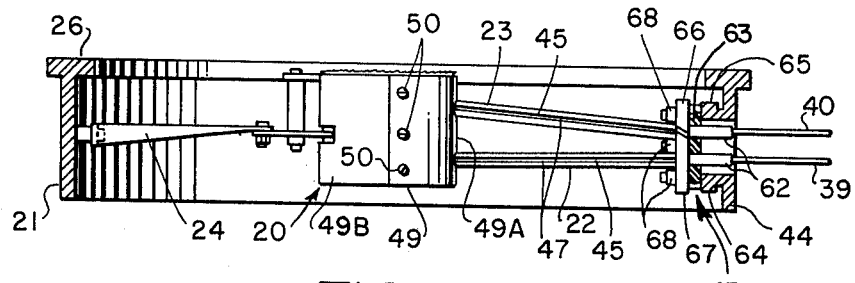
Figure 7:
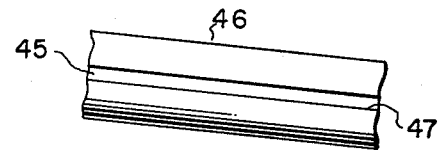
Figure 8:
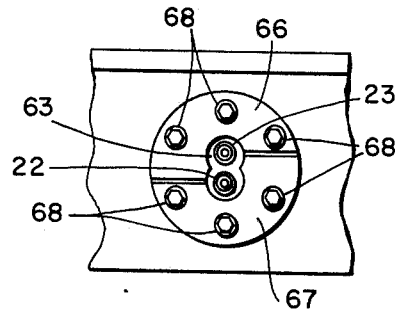
Figure 9:
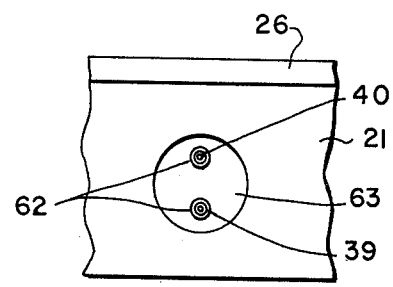
Figure 10:
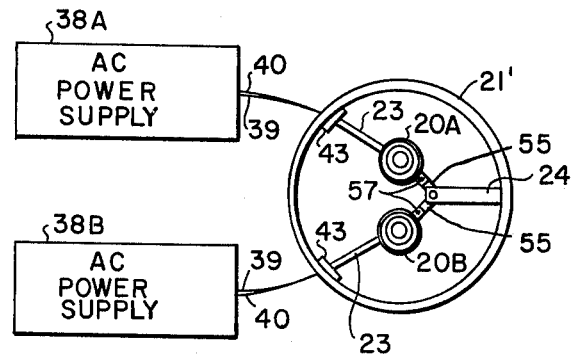
Figure 11:
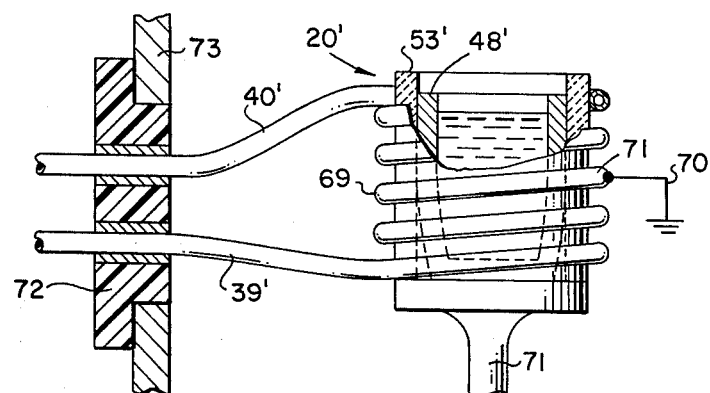
Figure 12:
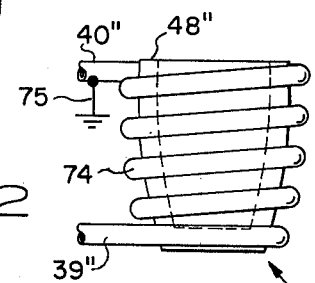
Figure 13:
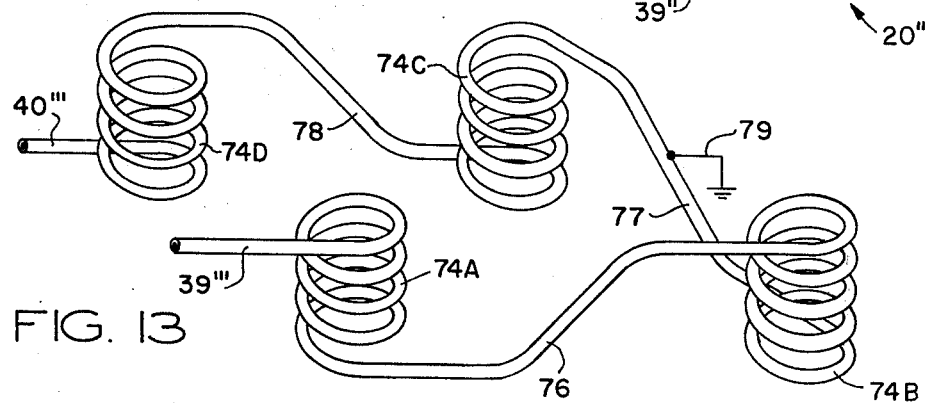
Figure 14:
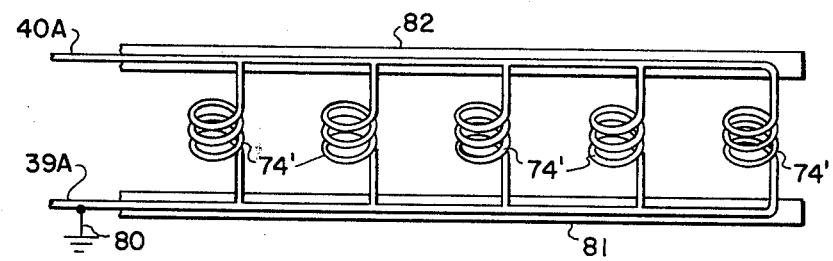
Figure 15:
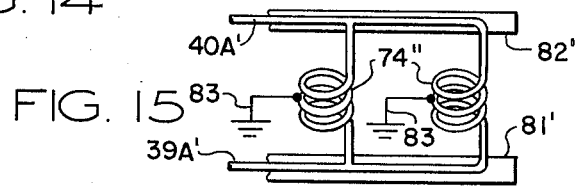

In the drawings:

FIG. 1 represents a partially broken away and sectioned view of a vacuum chamber such as used in ion plating processes;

FIG. 2, a partially cut away and sectioned perspective view of a feed through ring, used with the bell jar vacuum chamber of FIG. 1, and a work coil;

FIG. 3, a top view of the work coil of FIG. 2;

FIG. 4, a cut away and sectioned view along line 4—4 of FIG. 3, of an externally shielded work coil containing an inductive magnetic field variation responsive material crucible;

FIG. 5, a bottom view of the feed through ring and work coil assembly of FIG. 2;

FIG. 6, a back view of the work coil and feed through ring mounting detail taken from line 6—6 of FIG. 5;

FIG. 7, a partial detail of a power feed conduit;

FIG. 8, a partial detail of power feed conduit and feed through ring fitting taken from line 8—8 of FIG. 5;

FIG. 9, a partial detail of power feed conduit, to the outside of the feed-through ring fittings, taken from line 9 — 9 of FIG. 5;

FIG. 10, a top plan view of a feed-through ring with two work coils supported thereby, and individual external power supplies power line feed connected to the two work coils;

FIG. 11, a partially broken away and sectioned side elevation view of an ion plating source with a center ground tapped bare coil around a heat shield with a crucible therewithin supported by a pedestal;

FIG. 12, a side elevation view of a coil end grounded bare coil supporting a crucible;

FIG. 13, a perspective view of a group of four series connected work coils;

FIG. 14, a partial perspective view of a plurality of parallel connected work coils with a ground connection from one power supply line; and, FIG. 15, a partial perspective view of a plurality of parallel connected work coils with a center ground connection from each of the coils.

Referring to the drawings:

A high rate ion plating source 20 that functions as a material vaporizing and ion generating source for controlled environment material ion plating, in accord with applicant's teachings, is supported by feed-through ring 21, with the power feed conduits 22 and 23, and combination ground connection and support bracket 24. The feed through ring 21, along with bell jar 25 that is supported on annular ring shoulder 26, and the base 27 supporting feed-through ring 21, together, provide a closed controlled environment enclosure. Substrate items 28 to be ion plated are suspended by clamps 29 from a conductive mounting arm 30 of conductive material mounting post 31, anchored in and grounded by base 27. Evaporation line 32 with valve 33 is connected to opening 34 in base 27 for enclosure evacuation by an evacuation pump (not shown) connected through line 32 with the controlled environment bell jar enclosure. A gas supply line 35 with a metering control valve 36 is connected through opening 37 in base 27 for feeding a gas, desired for various plating processes, from a single gas source (not shown), or, selected gasses from a plurality of gas sources that valve-control feed the line 35, for desired chamber environment plating process control. Alternating current power source 38 feeds power through hollow, tubular, copper lines 39 and 40 that extends into and through feed-through ring fitting 63 and on through conduits 22 and 23 to work coil 42, that is a joining interconnection between the tubular lines 39 and 40. The tubular copper lines 39 and 40, and the tubular copper tubing through the work coil 42 advantageously permit cooling flow of cooling fluid, such as water, in through one line through the coil, and back out through the other line, to and from a cooling fluid source in and to the power supply 38 (interior detail not shown).

Referring also to FIGS. 3, 4, 5, 6, and 7, AC power lines extend through a fitting structure 43 in the wall 44 of feed-through ring 21, and through conduits 22 and 23 to connection with opposite ends of the multi-coiled, multi-turned work coil 42, in the ion plating source structure 20. The conduits 22 and 23 each include an insulative material (such as Teflon) tube 45, surrounded by a copper shield 46 that is split 47 throughout its length to minimize inductive power transfer from the power lines 39 and 40. This also helps limit ionizing power transfer primarily to vaporized material in the effective center region of the work coil 42, above the molten material containing and vaporizing carbon crucible 48. The copper shields 46 of conduits 22 and 23 are conductively interconnected, as by brazing or welding, to the outer conductive metal (such as copper) coil shield 49. Shield 49 is an assembly of two shield-half members 49A and 49B, shaped and fastened together so as to be an outer shield for work coil 42, with a split between the half members other than an overlap interconnect with screws 50, vertically up one side of the ion plating source 20 assembly. The split between the half-members 49A and 49B of shield 49 is to minimize inductive power transfer from work coil 42, while as a shield structure shape—modifying the magnetic field lines generated by the work coil 42 so as to minimize ionization energy transfer to the vapor plasma other than where intended, where the vaporized material rises from the crucible 48 and the source 20. This is with ionization of evaporant material atoms for sustained high particulate energy level ion plating deposition of plating material occurring primarily in the gas plasma generated with AC energy input (generally RF frequency input) for the ion plating process, as the vaporized material passes through the coil-induced RF energy-created magnetic field in its densest area, axially extended through the center area of the coil and immediately above the source 20. This is with magnetic field lines being generally toroidal, other than as modified by the external copper shield 49 generally surrounding the outer circumference and the bottom of the outermost coil-winding turns, with inwardly-extended bottom shield flanges 51A and 51B. The copper tubing forming the turns of work coil 42 is generally covered completely by fiber insulation 52 (such as aluminum oxide fiber batting) packed throughout the four concentric coil sections included in the ion plating source 20 embodiment shown in FIG. 4, so that only the inside of the work coil 42 is exposed—covered, but not sealed—to the plasma. The multi-turn feature of the coil 42 requires insulation batting between turns to maintain proper spacing and to prevent shorting between turns. The fiber insulation batting 52 extends across, under the coil 42 within shield 49, and supports a tubular aluminum oxide tube 53, and a cylindrical block 54 of non-inductive insulative material supporting the inductive material (carbon) crucible 48, at a desired location high within the coil structure.

A ground strap 55 is connected through a clearance slot 56 in shield half member 49B, to a coil turn near the middle of the coil structure, with the strap 55 securely held in fixed position by insulator spacer assembly 57, in order that the shield 49 may float relative to ground and the feed-through ring 21 connected to support bracket 24. Insulated spacer assembly 57 includes an insulated spacer tube 58 and insulated washer 59 assembled together with a bolt assembly 60 anchored in flange 61 of shield half 49B. Thus, the work coil 42 is generally encased in a mechanical shield that floats from all voltage and ground, has an aluminum oxide tubular liner and a carbon crucible. In a working unit, an RF power supply supplied 210 to 230 volts, at 22 amps, to the work coil 42 to RF induction heat the crucible 48, in a unit capable of heating and evaporating metal all the way from atmospheric pressure to hard vacuum, with no arcing.

The power supply 38 power lines 39 and 40 feed into feed-through ring power connectors 62, that bottom on a disc 63 of insulative material (such as Teflon) mounted in place on the inward facing annular shoulder 64 of power feed-through tubular fixture 65. The insulative material disc 63 is mounted in place by two metal mounting members 66 and 67 and bolt studs 68, extended through the members 66 and 67, the disc 63, and into the shoulder 64, with the metal mounting members 66 and 67 separated from each other by slanted space slots to minimize inductive pickup power loss. Different power supplies may be employed as the AC power supply 38, such as for example a transformer-coupled power supply with a ground connection to the most critical point—at or near the center of the work coil 42, such as shown in FIG. 4. If a plate-coupled transmitter is used as the power supply 38, then the ground connection to the coil is made at the coil-termination-into-low-voltage side. An SCR firing circuit can be used to establish an expanding and collapsing field, as the power supply 38 providing both heating and ionization. Pleast note further that electrical and mechanical configuration system requirements are such as to not impose rigid restrictions upon the size, configuration, or orientation of the work coil 42 and the crucible, or susceptor, used, other than that it be made of an inductive material such as carbon.

The carbon crucible 48 in the ion plating source 20 readily inducts in the RF field of the coil 42. The tubular aluminum oxide heat shield 53, in being transparent to RF, allows the energy to couple to the crucible while its radiant heat insulation properties resist radiant loss of heat while there is some heat loss with evaporation of material heated in the crucible. Such efficient use of power achieves approximately a threefold operating energy saving over electron beam guns for materials like aluminum. The metal shield 49, generally surrounding the coil 42, inhibits coupling of the RF into the surrounding plasma, other than to the vaporized material where desired above the crucible, that would otherwise result in significant power losses. Further, the ion plating source 20 design is such that the bare surface of the work coil 42 operates effectively, voltage tuned below the threshold where destructive arcs occur. Normal operation is with an AC power supply operating at 450 KC supplying a high impedance work coil 42 constructed of turns of copper tubing, with cooling water circulated therethrough. The work coil 42 and the source 20 effectively evaporate materials such as aluminum, at high vacuum, and generates a bluish plasma with the metal vapor. The work coil 42 equipped source 20 also does very well in an argon gas atmosphere. It is of interest that ion plating of a 0.0005 inch thickness of aluminum film has been ion plated onto 0.005 inch thickness sheets of mylar, using applicant's ion plating source and system. This is accomplished with—and, despite—total optical baffling of the ion plating source from the substrate, to completely eliminate direct radiant heating of the substrate, and thereby to allow for a much fasther deposition, without thermal damage to the mylar. Brighter and lower resistivity films result when the vacuum system is at high vacuum and free of the inert gases previously associated with ion plating.

Since the ion plating source 20 is not pressure dependent, it may be employed for another use, a use in the field of vacuum metallurgy. This use involves the reclaiming of expensive metal alloys through the melting of machine cuttings into ingots. This can be done by operating a continuously-fed ion plating source 20 in an inert gas atmosphere of sufficient pressure to prevent any material vaporization loss of any alloy constituent. Pleast note that, while not shown, continuous feed systems of the art may be structurally combined in a working system with an ion plating source 20 in substantially any of its operational forms.

Referring now to the ion plating system implementation of FIG. 10, two ion plating sources 20A and 20B are mounted by feed-through ring 21' with power supplies 38A and 38B supplying the respective ion plating sources 20A and 20B. Combination mounting support and ground bracket 24 is connected to grounding straps 55 and the insulated spacer assembly 57 of the two ion plating sources 20A and 20B. Thus, a plurality of ion plating sources may be used in one plating system where they may be activated simultaneously or at different times for sequential steps in ion plating successive layers of different ion plated materials. It is sometimes desirable, as when plating large objects, to have multiple sources operating simultaneously from the same power supply. This may be accomplished by simple series or parallel connection, depending upon which connection better suits the requirements of the particular vacuum chamber and power supply.

The ion plating source 20' of FIG. 11 includes a single section work coil 69 power fed from a power supply such as a transformer coupled AC power supply, through hollow tubular copper lines 39' and 40'. The work coil 69 is a joining tubular copper line interconnection between the tubular lines 39' and 40' to advantageously permit cooling flow of cooling fluid, such as water, in through one line, through the coil, and back out the other line, to and from a cooling fluid source in and to the power supply (not shown) that in this instance must be a transformer-coupled power supply. This must be a transformer-coupled power supply to permit a center tap connection 70 to a voltage potential reference source (i.e., ground) from the center turn 71 of work coil 69. A non-inductive insulative material tube 53' (such as an aluminum oxide, or other metal oxide, tube) is supported within work coil 69 along with an inductive material (such as carbon) susceptor in the form of crucible 48' by a non-inductive material support pedestal 71. The ground tap 70 could be at any location on the work coil 69 from one lead 39' and 40' to the other with a transformer-coupled power supply (not shown) with the leads 39' and 40' extended through a through-wall fixture 72 in controlled environment chamber wall 73, with, however, a center tap (as shown) being especially good in preventing arcing potential build up in the system.

In the ion plating source 20" embodiment of FIG. 12, a coil 74 end tap connection 75 to ground is shown such as would be required with a plate-coupled AC power supply consistent with grounding connection within the power supply. If the connection to the power supply is reversed to tubular copper lines 39" and 40", the coil end tap connection to ground would be from the opposite end of the work coil 74. The work coil 74 shows a coil configuration modification wherein the coil 74 has more tightly wound coil turns at the bottom to, itself, be a holder and support for an inductive material crucible 48" held therewithin. This could be a work coil modification applicable to other work coils where desired with or without a refractory heat shield interposed between the inductive material crucible and the turns of the coil. It must be recognized, however, that radiant heat loss and power dissipation is much greater when an ion plating source is used without a refractory heat shield between the susceptor and the coil turns.

With the ion plating system implementation of FIG. 13, four series-connected work coils 74A, 74B, 74C, and 74D are shown with tubular power line 39''' connected to and through coil 74A, through interconnect tubular line 76 to and through coil 74B, through interconnect tubular line 77 to and through coil 74C, through interconnect tubular line 78 to and through coil 74D and out through tubular power line 40'''. This advantageously also permits cooling water through-flow from an AC power supply (not shown), and with a transformer coupled power supply, the interconnect tubular line 77 may be advangageously connected through tap connection 79 to ground, as a system center tap connection to ground. This center tap ground is better than tap connections elsewhere from line 39''' to 40''', although such ground taps may be accomplished with a transformer-coupled AC power supply. If a plate-coupled power supply is used, then a ground connection is required from either power line 39''' or power line 40''', depending upon the connection orientation of the power supply.

With the ion plating system implementation of FIG. 14, a plurality of parallel connected work coils 74' are opposite-end-connected to power lines 39A and 40A, from an AC power supply (not shown). The AC power supply may be either a transformer-coupled power supply or a plate-coupled power supply with power line 39A having a tap connection 80 to ground. Each of the work coils 74' and the power lines 39A and 40A, that are supported as an assembly on frame rails 81 and 82, are formed of copper tubing for through flow of cooling fluid from and back to the power supply.

The ion plating system of FIG. 15 is much the same as that of FIG. 14, except that the work coils 74'' are provided with center tap connection 83 to ground, and as a consequence, the AC power supply (not shown) must be a transformer-coupled power supply. The tubular power lines 39A' and 40A' and frame rails 81' and 82' are otherwise substantially the counterpart of like components found in FIG. 14.

Obviously, a great range of different controlled environment chambers are suitable for use of such ion plating sources in various size and structural configurations, and numbers thereof, in being adapted to meet various ion plating production requirements.

Whereas, this invention is herein illustrated and described with respect to a plurality of embodiments thereof, it should be realized that various changes may be made without departing from the essential contributions to the art made by the teachings hereof.

I claim:

1. In an ion generating source within a controlled environment enclosure for high particulate energy level ion plating deposition of plating material on substrates: multi-turn work coil means; power supply conductive two-line means for interconnecting RF power supply means and opposite ends of said multi-turn work coil means; said multi-turn work coil means being constructed to contain an inductive magnetic field variation responsive material susceptor within the center of said multi-turn work coil means; support means for said susceptor; an RF power supply voltage potential reference source physically connected to said multi-turn work coil means; electrically conductive material shield means generally circumferentially enclosing said multi-turn work coil means; said electrically conductive material shield means separation split on one side and joined together on a vertical side opposite the separation split, to minimize inductive pickup power loss, and to inhibit coupling of RF into surrounding plasma, other than to vaporized material, where desired, above the susceptor; said electrically conductive shield means being insulated from said RF power supply voltage potential reference source and also insulated from said power supply conductive two-line means, to float, relative to RF power input and relative to said RF power supply voltage potential reference source.

2. The ion generating source of claim 1, wherein said power supply conductive two-line means and said multi-turn work coil means are formed from hollow tubing, for flow of cooling fluid in through one of the lines of said power supply conductive two-line means, through said multi-turn work coil means, and out through the other of the lines of said power supply conductive two-line means.

3. The ion generating source of claim 1, with refractory heat shield means transparent to RF energy through the ionizing frequencies range interposed between said inductive material crucible and said multi-turn work coil, to allow inductive RF energy to enter the crucible, while heat shielding radiant heat loss from the crucible region.

4. The ion generating source of claim 3, wherein said refractory heat shield means is a tubular metal oxide heat shield; and said inductive magnetic field variation responsive material susceptor is a carbon crucible.

5. The ion generating source of claim 1, wherein said RF power supply voltage potential reference source is connected to said multi-turn work coil means at a coil turn in the center region of said coil.

6. The ion generating source of claim 5, wherein said work coil is a multi-section work coil with the coil sections in concentric relationship.

7. The ion generating source of claim 6, wherein said voltage potential reference source connection to said multi-turn work coil includes an ion generating source support member structurally connected to said shield means; and with said voltage potential reference source having connective means extended from said support member through a clearance opening in said shield means and on to connection with a turn of said multi-turn work coil.

8. The ion generating source of claim 7, wherein said multi-turn work coil is positioned within a wall structure; and wherein said power supply conductive two-line means is passed through insulative wall fixture means supported by said wall structure.

9. The ion generating source of claim 8, wherein said power supply conductive two-line means is in the form of two power feed conduits and said ion generating source support member cooperatively together support said ion generating source from said wall structure.

10. The ion generating source of claim 9, wherein said wall structure is part of said controlled environment enclosure.

11. The ion generating source of claim 9, wherein the two power feed conduits between said wall structure and said multi-turn work coil are each in the form of conductive metal tubing encased in an insulative material tube, in turn surrounded by a conductive metal shield with a split throughout its length to minimize inductive power transfer from the conductive metal tubing power feed line therein.

12. The ion generating source of claim 1, with said multi-turn work coil shaped to be the support means for said susceptor.

13. In an ion generating system, a plurality of the ion generating sources of claim 1, wherein a plurality of said work coils are connected in parallel between said power supply conductive two-line means.

14. The ion generating system of claim 13, wherein said power supply conductive two-line means and each of said plurality of work coils are formed from hollow, electrically conductive, material tubing for flow of cooling fluid in through one of the lines of said power supply conductive two-line means, through the plurality of work coils in parallel, and out through the other of the lines of said power supply conductive two-line means.

15. The ion generating system of claim 14, with one of said power supply conductive two-line means connected as said voltage potential reference source connection for said plurality of work coils.

16. The ion generating system of claim 14, wherein said voltage potential reference source connection to each of said work coils is to the center region of each of said plurality of work coils.

17. In an ion generating system, a plurality of the ion generating sources of claim 5, wherein a plurality of said work coils are connected in series between said power supply conductive two-line means.

18. The ion generating system of claim 17, wherein said power supply conductive two-line means and said plurality of said work coils are formed of a continuous run of hollow, electrically conductive material tubing for flow of cooling fluid in through one of the lines of said power supply conductive two-line means, through the work coils in series, and out through the other of the lines of said power supply conductive two-line means.

19. The ion generating system of claim 17, wherein the center region of said plurality of series-connected work coils is connected as said voltage potential reference source connection to said multi-turn work coil means.

20. The ion generating system of claim 19, wherein said plurality of series connected work coils is an even number of work coils; and said voltage potential reference source connection to said multi-turn work coil means is to a tubular interconnecting link between two of said work coils.

* * * * *